(12) United States Patent
Hwang et al.

(10) Patent No.: US 11,189,512 B2
(45) Date of Patent: Nov. 30, 2021

(54) STOCKER

(71) Applicant: SEMES CO., LTD., Cheonan-si (KR)

(72) Inventors: Bo Seung Hwang, Yongin-si (KR); Seung Keun Jun, Asan-si (KR)

(73) Assignee: SEMES CO., LTD., Cheonan-si (KR)

( * ) Notice: Subject to any disclaimer, the term of this patent is extended or adjusted under 35 U.S.C. 154(b) by 287 days.

(21) Appl. No.: 16/439,161

(22) Filed: Jun. 12, 2019

(65) Prior Publication Data

US 2019/0382213 A1 Dec. 19, 2019

(30) Foreign Application Priority Data

Jun. 14, 2018 (KR) .......................... 10-2018-0068122

(51) Int. Cl.
| | |
|---|---|
| *H01L 21/677* | (2006.01) |
| *H01L 21/68* | (2006.01) |
| *B25J 9/16* | (2006.01) |
| *B65G 47/90* | (2006.01) |

(52) U.S. Cl.
CPC ........ *H01L 21/67742* (2013.01); *B25J 9/163* (2013.01); *B25J 9/1694* (2013.01); *H01L 21/68* (2013.01); *B65G 47/907* (2013.01); *B65G 2201/0297* (2013.01)

(58) Field of Classification Search
CPC ................................................ H01L 21/67742
See application file for complete search history.

(56) References Cited

U.S. PATENT DOCUMENTS

| | | | | |
|---|---|---|---|---|
| 2009/0082895 A1* | 3/2009 | Barker | ................... | H01L 21/68 |
| | | | | 700/112 |
| 2018/0090356 A1* | 3/2018 | Miyamoto | ........ | H01L 21/67718 |

FOREIGN PATENT DOCUMENTS

| | | | | |
|---|---|---|---|---|
| JP | 2004-95600 | | 3/2004 | |
| KR | 10-2007-0069990 | | 7/2007 | |
| KR | 10-2016-0004583 | | 1/2016 | |
| KR | 20160004583 A | * | 1/2016 | ........... H01L 21/677 |
| KR | 10-1647923 | | 8/2016 | |

OTHER PUBLICATIONS

Korean Office Action, with English translation, corresponding to Korean Application No. 10-2018-0068122, dated Dec. 3, 2019.

* cited by examiner

*Primary Examiner* — Thomas Randazzo
(74) *Attorney, Agent, or Firm* — Kile Park Reed & Houtteman PLLC

(57) ABSTRACT

A stocker may include a load port which a cassette for receiving wafers is either loaded on or unloaded from, an aligner configured to align the wafers and to confirm identification codes of the wafers, a plurality of shelves each having slots for receiving the wafers, a first transfer robot having a first robot arm for transferring the wafers between the load port and the aligner and a second transfer robot having a second robot arm for transferring the wafers between the aligner and the shelves.

6 Claims, 3 Drawing Sheets

STOCKER

CROSS-REFERENCE TO RELATED APPLICATION

This application claims the priority benefit of Korean Patent Application No. 10-2018-0068122, filed on Jun. 14, 2018, and all the benefits accruing therefrom under 35 U.S.C. § 119, the contents of which are incorporated by reference in their entirety.

BACKGROUND

The present disclosure relates to a stocker, and more particularly, to a stocker for receiving wafers to shelves.

In a method of manufacturing a semiconductor device, cassettes in which wafers are received is stored in a stocker. The stocker includes a plurality of shelves for receiving the cassettes. The shelves are arranged in horizontal and vertical directions. A robot for transporting the cassettes is disposed inside the stocker. The robot is movable in the horizontal and vertical directions, and transports the cassettes.

In the stocker, the wafers are transferred in a state received in the cassettes and stored in the shelves. Therefore, it is difficult to sort the wafers according to a predetermined reference in the stocker.

SUMMARY

The present invention provides a stocker capable of sorting wafers received in a cassette according to a predetermined reference.

In accordance with an aspect of the present disclosure, the stocker may include a load port which a cassette for receiving wafers is either loaded on or unloaded from, an aligner configured to align the wafers and to confirm identification codes of the wafers, a plurality of shelves each having slots for receiving the wafers, a first transfer robot having a first robot arm for transferring the wafers between the load port and the aligner and a second transfer robot having a second robot arm for transferring the wafers between the aligner and the shelves.

In accordance with some exemplary embodiments of the present disclosure, the aligner may include a rotating member configured to align the wafers by supporting and rotating the wafers, centering members arranged radially with respect to the rotating member, each being configured to be movable toward the rotating member, and to move the wafer positioned on the rotating member to align a center of the wafer with respect to a center of the rotating member, and a recognition unit disposed over the rotating member and being configured to recognize the identification codes of the wafers which the rotating member supports.

In accordance with some exemplary embodiments of the present disclosure, the stocker may further include a controller being configured to obtain pre-stored information about wafers using the identification codes of the wafers acquired from the aligner, and to control an operation of the second transfer robot to transfer one of the wafers to one of the shelves or draw the one of the wafers from the one of the shelves according to the pre-stored information.

In accordance with some exemplary embodiments of the present disclosure, the stocker may further include a teaching mark disposed on a bottom surface of each of the shelves for teaching the second transfer robot, and a teaching unit mounted on the second robot arm of the second transfer robot and being configured to obtain information for teaching the second transfer robot using the teaching mark.

In accordance with some exemplary embodiments of the present disclosure, the stocker may further include a reflector disposed at a front end portion of an upper surface of each of the shelves, and a first sensor mounted on the second transfer robot, the first sensor configured to be positioned below the reflector, and irradiate light toward the reflector to detect the light reflected by the reflector to determine whether the second transfer robot is in position and whether the wafers loaded on the shelves are protruded.

In accordance with some exemplary embodiments of the present disclosure, the stocker may further include second sensors mounted on the second transfer robot and being configured to be respectively positioned at both sides of each of the wafers loaded on the each of the shelves and to move in a vertical direction to detect whether each of the wafers is loaded on the each of the shelves.

In accordance with some exemplary embodiments of the present disclosure, the stocker may further include level sensing units arranged in a moving path of the first transfer robot and a moving path of the second transfer robot, respectively, and each having a pair of third sensors for sensing deflection of the first robot arm and deflection of the second robot arm.

In accordance with the exemplary embodiments of the present invention, the stocker obtains the pre-stored information about wafers using the identification codes of the wafers and controls the operation of the second transfer robot so that the second transfer robot transfers the wafer to the specific one of the shelves or draws the wafer from the specific one of the shelves according to the pre-stored information. Accordingly the stocker may sort the wafers received in the cassette according to a predetermined reference so as to store in the each of the shelves. In addition, the stocker may selectively draw the wafers from the each of the shelves so as to store in the cassette. Therefore, the stocker may sort the wafers according to the predetermined reference therein.

In addition, the stocker may easily and quickly perform a teaching operation using the teaching mark disposed on the each of the shelves and the teaching unit mounted on the second transfer robot.

The stocker may detect whether the second transfer robot is stationary or whether the wafers loaded on the shelves are protruded using the reflector disposed at the front end portion of the upper surface of the each of the shelves and the first sensor mounted on the second transfer robot. In addition, the stocker may detect positions of the wafers loaded on the each of the shelves using the second sensors mounted on the second transfer robot. Therefore, it is possible to prevent the second transfer robot and the wafers from being damaged due to collision of the wafers loaded on the each of the shelves with the second transfer robot.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
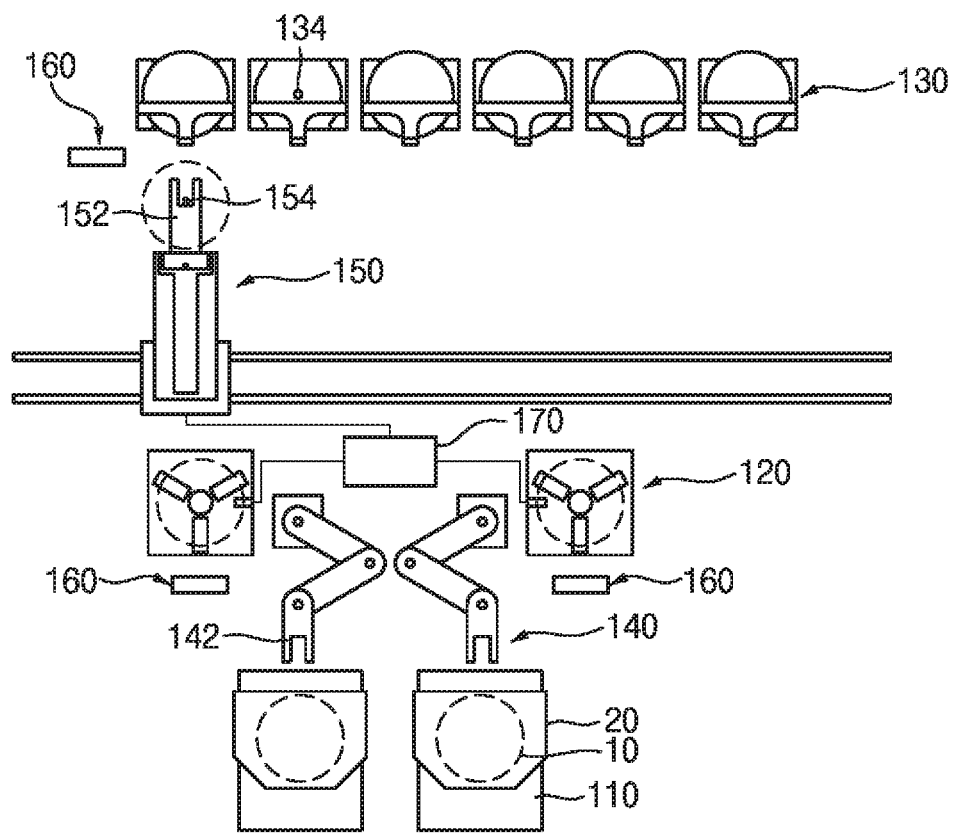
FIG. 1 is a plan view illustrating a stocker in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

Hereinafter, specific embodiments on a stocker will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout. In the figures, the dimensions of layers and regions are exaggerated for clarity of illustration.

The terms such as first, second, etc., can be used in describing various elements, but the above elements by the above terms should not be limited. The above terms are one element from the other used only to distinguish. For example, in the present invention without departing from the scope of the first component to the second component may be named similarly, the second component to the first component also can be named.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a stocker in accordance with an exemplary embodiment of the present disclosure.

Referring to FIG. 1, a stocker 100 may include a load port 110, an aligner 120, shelves 130, a first transfer robot 140, and a second transfer robot 150.

A cassette 20 for receiving wafers 10 is either loaded on the load port 110 or unloaded from the load port 110. The cassette 20 may be transported by an overhead hoist transport (not shown).

For example, the load port 110 includes one port, and steps of loading and unloading the cassette 20 may be alternately performed at the load port 110. Alternatively, the load port 110 is provided in a plural such that a loading port for loading the cassette 20 and an unloading port for unloading the cassette 20 are provided.

The aligner 120 may be disposed at one side of the load port 110. The aligner 120 aligns the wafers 10 stored in the cassette 20.

A process of aligning the wafer 10 with the aligner 20 takes a relatively much time. The aligner 120 may be provided in plural in order to quickly align the wafers 10.

Figure 2:
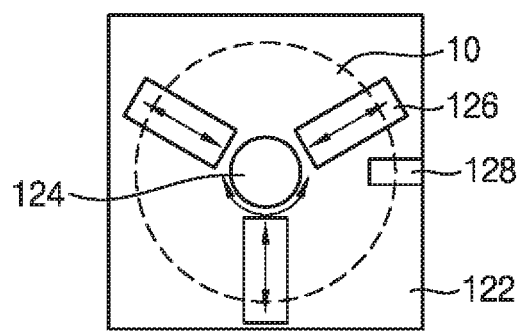
FIG. 2 is a plan view illustrating an aligner shown in FIG. 1.

FIG. 2 is a plan view illustrating an aligner as shown in FIG. 1.

Referring to FIG. 2, the aligner 120 may include a stage 122 having a plate shape.

A rotating member 124 may be disposed on a center portion of an upper surface of the stage 122 to support and rotate the wafer 10. Accordingly, the rotating member 124 may rotate and align the wafer 10.

Centering members 126 may be radially arranged on the upper surface of the stage 110 with respect to the rotating member 124. In addition, the centering members 126 may move toward the rotating member 124. Accordingly, the centering members 126 may move the wafer 10 which the rotating member 124 supports to align a center of the wafer 10 with a center of the rotating member 124.

A recognition unit 128 may be disposed over the upper surface of the stage 122 and recognize identification codes of the wafer 10 which the rotating member 124 supports. Examples of the identification codes include numerals, letters, combinations of the numbers and the letters, bar codes, and QR codes, etc.

Thus, the aligner 120 may align the wafers 10 and easily identify the identification codes of the wafers 10.

The shelves 130 support the wafers 10. The shelves 130 may be arranged in a first horizontal direction (an X-axis direction) and a vertical direction (a Z-axis direction). Although the shelves 130 are arranged in a single row in FIG. 1, the shelves 130 may be arranged in two rows to be in parallel to each other.

Each of the shelves 130 is provided with a plurality of slots 132 for receiving the wafers 10 therein. The slots 132 are disposed on both sides of the each of the shelves 130 in the first horizontal direction. The slots 132 support both ends of each of the wafers 10 and a plurality of the wafers 10 are stacked on the each of the shelves 130 in the vertical direction.

The first transfer robot 140 transfers the wafers 10 between the load port 110 and the aligner 120. The first transfer robot 140 may be configured to be movable in the vertical direction and rotatable for transferring the wafers 10. Although not shown in detail in FIG. 1, the first transfer robot 140 may include a vertical driving part for moving the first transfer robot 140 in the vertical direction and a rotation driving part for rotating the first transfer robot 140.

The first transfer robot 140 may include a first robot arm 142 for transferring the wafers 10 and the first robot arm 142 may be configured to be movable between the load port 110 and the aligner 120. For example, the first robot arm 142 may be an articulated robot arm capable of be elongated and contracted.

Therefore, the first transfer robot 140 draws the wafers 10 from the cassette 20 which the load port 110 supports and then transfers the wafers 10 to the rotating member 124 of the aligner 120. In addition, the first transfer robot 140 transfers the wafer 10 from the rotating member 124 of the aligner 120 and into the cassette 20 which the load port 110 supports.

Alternatively, the first transfer robot 140 may be provided in a plurality to transfer the wafers 10 quickly.

Also, although not shown FIG. 1, the first transfer robot 140 may be configured to be movable in a second horizontal direction (a Y-axis direction) perpendicular to the first horizontal direction. Therefore, the first transfer robot 140 may transfer the wafers 10 more quickly.

The second transfer robot 150 transfers the wafers 10 between the aligner 120 and the shelves 130. The second transfer robot 150 may be configured to be movable in the first horizontal direction and the vertical direction and to be rotatable for transferring the wafers 10. Although not shown in detail in FIG. 1, the second transfer robot 150 may include a first horizontal driving part for moving the second transfer robot 150 in the first horizontal direction, a vertical driving part for moving the second transfer robot 150 in the vertical direction, and a rotation driving part for rotating the second transfer robot 150.

The second transfer robot 150 may include a second robot arm 152 for transferring the wafers 10 into the shelves 130 or for drawing the wafers 10 from the shelves 130. The second robot arm 152 may be configured to be movable between the aligner 120 and the shelves 130. For example, the second robot arm 152 may be configured to be movable in the second horizontal direction, and the second transfer robot 150 may include a second horizontal driving part for moving the second robot arm 152.

For example, the first and second horizontal driving parts, the vertical driving part, and the rotation driving part may be configured by using a power transmission device including a motor, a timing belt, and pulleys.

Therefore, the second transfer robot 150 may draw the wafer 10 from the rotating member 124 of the aligner 120 and transfer the wafer 10 into the shelves 130. In addition, the second transfer robot 150 may draw the wafers 10 from the shelves 130 and place the wafers 10 on the rotating member 124 of the aligner 120.

The stocker 100 may include a controller 170 for controlling an operation of the second transfer robot 150 using the identification codes of the wafers 10 acquired by the aligner 120.

Particularly, the controller 170 may acquire pre-stored information about the wafers 10 using the identification codes of the wafers 10 acquired by the recognition unit 128 of the aligner 120. The pre-stored information may include process information on what steps are performed against each of the wafers 10, test result information on the wafers 10, etc. The controller 170 controls the operation of the second transfer robot 150 according to a predetermined reference based on the pre-stored information. Therefore, the second transfer robot 150 may transfer the wafer 10 aligned in the aligner 120 to one of the shelves 130, and transfer the wafer 10 from the one of the shelves 130 to the aligner 120. The predetermined reference may be automatically set by the controller 170 based on the pre-stored information. Alternatively the operator may set the predetermined reference based on the pre-stored information to be transferred to the controller 170.

Accordingly, the stocker 100 may sort the wafers 10 received in the cassette 20 according to the predetermined reference so as to store in the each of the shelves 130. In addition, the stocker 100 may selectively draw the wafers 10 from the each of the shelves 130 so as to store in the cassette 20. Therefore, the stocker 100 may sort the wafers 10 therein according to the predetermined reference.

Figure 3:
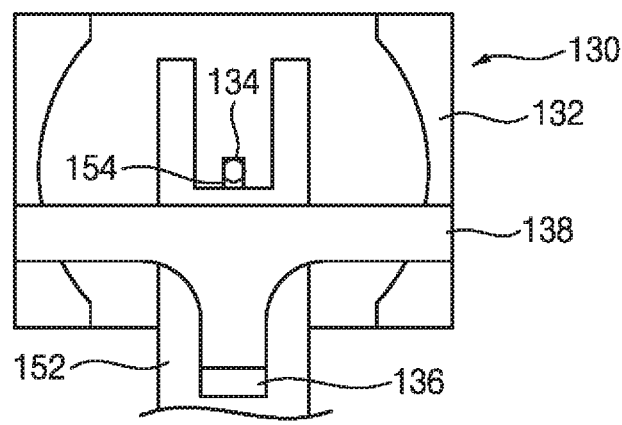
FIG. 3 is a plan view illustrating a teaching operation of a second transfer robot shown in FIG. 1.

FIG. 3 is a plan view illustrating a teaching operation of a second transfer robot as shown in FIG. 1.

Further, referring to FIG. 3, each of the shelves 130 may be configured to include a teaching mark 134 for teaching the second transfer robot 150. For example, the teaching mark 134 may be disposed on a bottom surface of the each of the shelves 130. Thus, the teaching mark 134 may be used to teach a moving distance by which the second transfer robot 150 moves in the first horizontal direction, that is, a Y axis coordinate and a moving distance of the second robot arm 152 in the second horizontal direction, that is, the Y axis coordinate.

A teaching unit 154 may be mounted on the second robot arm 152. The teaching unit 154 is configured to teach the second transfer robot 150 using the teaching mark 134. For example, the teaching unit 154 may be configured to recognize the teaching mark 134 and acquire teaching information for teaching the second transfer robot 150 using the teaching mark 134. The teaching unit 154 is mounted on the second robot arm 152 so that the teaching unit 154 may be inserted into the each of the shelves 130 according to a operation of the second transfer robot 150 and the second robot 152 to recognized the teaching mark 32.

Although not shown in detail, according to an embodiment of the present invention, the teaching mark 134 may have various shapes such as a circle, an ellipse, a cross shape, and the teaching unit 154 may include a camera for recognizing the teaching mark 134.

According to an example embodiment of the disclosure, the teaching mark 134 may includes a QR code, and the teaching unit 154 may include a QR code scanner for recognizing the QR code. For example, the QR code may include information such as numbers indicating positions of the shelves 130, etc.

In addition, the controller 170 may perform a step of teaching the second transfer robot 150 using the teaching information acquired by the teaching unit 154.

Particularly, the teaching unit 154 may acquire an image of the teaching mark 134. The controller 170 may obtains an image coordinate corresponding to a specific position such as a center or an edge of the teaching mark 134 from the image of the teaching mark 134 and compares the obtained image coordinate with a predetermined reference position coordinate. Therefore the controller 170 may detect an actual position of the second transfer robot 150. Then, the controller 170 may perform a step of teaching the second transfer robot 150 using a difference between the obtained image coordinate and the predetermined reference position coordinate.

For example, after the second transfer robot 150 is moved to face a front of the each of the shelves 130 by using the predetermined reference position coordinate, the teaching unit 154 may obtain the image of the teaching mark 134. The controller 170 may obtain the image coordinate for the specific position of the teaching mark 134 from the image of the teaching mark 134. The controller 170 may compare the obtained image coordinate and the predetermined reference position coordinate to calculate difference values. Also, the controller 170 may correct the predetermined reference position coordinate of the second transfer robot 150 using the difference values.

Then, the controller 170 may move the second transfer robot 150 to a corrected predetermined reference position coordinate. Also, the controller 170 may confirm whether the predetermined reference position coordinate of the second transfer robot 150 is accurately corrected using the teaching unit 154.

Figure 4:
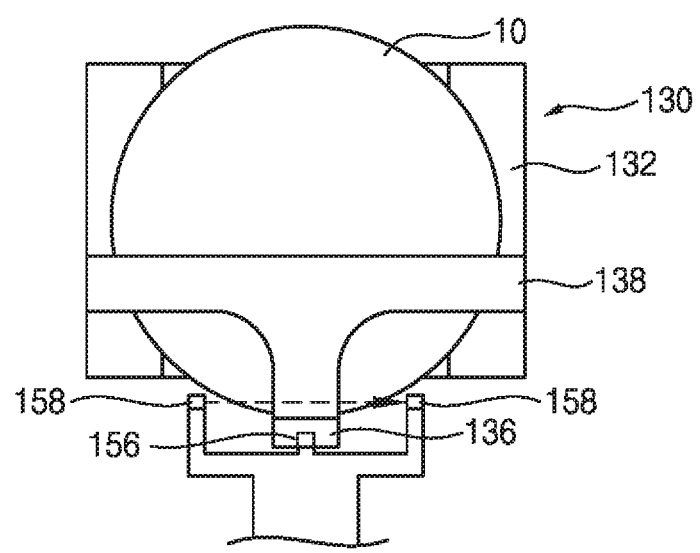
FIG. 4 is a plan view illustrating an operation of a reflector, a first sensor, and second sensors shown in FIG. 1.

FIG. 4 is a plan view illustrating an operation of a reflector, a first sensor, and second sensors as shown in FIG. 1.

Further referring to FIG. 4, a reflector 136 may be disposed on the each of the shelves 130. For example, the reflector 136 may be disposed at a front end portion of an upper surface of the each of the shelves 130. The reflector 136 may be mounted to the each of the shelves 130 by using a reflector jig 138.

The stocker 100 further may include a first sensor 156. The first sensor 156 may be disposed to be connected to the second transfer robot 150. The first sensor 156 may be configured to be movable below the reflector 136. For example, the first sensor 156 may be configured to be movable in the second horizontal direction, and a second horizontal driving part for moving the first sensor 156 may be configured to move the second transfer robot 150. Here, the first sensor 156 may move in the second horizontal direction, independent from the second horizontal movement of the second robot arm 152. Therefore, the first sensor 156 may detect whether the second transfer robot 150 is in position and whether the wafers 10 are protruded from the each of the shelves 130.

Specifically, the first sensor 156, which is positioned under the reflector 136, irradiates light toward the reflector 136 and detects a light reflected from the reflector 136. Here, the wafers 10 may not be positioned on the each of the shelves 130 so that the wafers 10 do not block the light irradiated from the first sensor 156. When the first sensor 156 detects the light reflected from the reflector 136, whether the second transfer robot 150 is positioned at a reference position with respect to the each of the shelf 130 may be determined. When the first sensor 156 does not detect the light reflected from the reflector 136, whether the second transfer robot 150 is not positioned at the reference position with respect to the each of the shelf 130 may be determined. When the first sensor 156 does not detect the light reflected from the reflector 136, the second transfer robot 150 is moved in the first horizontal direction until the first sensor 156 detects the light reflected from the reflector. Therefore, the second transfer robot 150 may be positioned at the reference position with respect to the each of the shelf 130.

After the second transfer robot 150 is positioned at the reference position with respect to the each of the shelf 130, the first sensor 156 which is positioned under the reflector 136 irradiates light toward the reflector 136 and detects the light reflected from the reflector 136. Here, the wafers 10 may be loaded on each of the shelves 130.

When the first sensor 156 detects the light reflected from the reflector 136, it is determined that the wafers 10 are loaded on the each of the shelves 130 at a normal position. When the first sensor 156 does not detect the light reflected from the reflector 136, it is determined that the wafers 10 are loaded on the each of the shelves 130 at a protruded position other than the normal position. Therefore, it is possible to detect whether the wafers 10 are protruded from the each of the shelves 130.

Since the second transfer robot 150 may be positioned at the reference position with respect to the each of the shelf 130 and it is possible to detect whether the wafers 10 are protruded from the each of the shelves 130, it is prevent the second transfer robot 150 and the wafers 10 from being damaged by collision between the second transfer robot 150 and the shelves 130 or the second transfer robot 150 and the wafers 10 loaded on the each of the shelves 130 while the second transfer robot 150 transfers the wafers 10.

The stocker 100 may further include a pair of second sensors 158. The second sensors 158 may detect a position of the wafers 10 loaded on the each of the shelves 130.

The second sensors 158 are disposed to the second transfer robot 150. The second sensors 158 may be configured to be movable toward the each of the shelves 130. For example, the second sensors 158 may be configured to be movable in the second horizontal direction, and a second horizontal driving part for moving the second sensors 158 may be configured to the second transfer robot 150. Here, the second sensors 158 may move in the second horizontal direction separately from the second horizontal movement of the second robot arm 152. The second sensors 158 may move in the second horizontal direction simultaneously with the first sensor 156.

Also, since the second transfer robot 150 moves in the vertical direction, the second sensors 158 mounted to the second transfer robot 150 may also move in the vertical direction.

Particularly, after the second sensors 158 are positioned at an entrance of the each of the shelves 130, one of the second sensors 158 irradiates a light and the other of the second sensors 158 detects the irradiated light while the second sensors 158 moves in the vertical direction.

When the second sensors 158 detect the light, it is determined that there is no wafer 10 in the slots 132 of the each of the shelves 130. When the second sensors 158 do not detect the light, it is determined that the wafer 10 exists in the slots 132 of the each of the shelves 130. Therefore, positions of the wafers 10 loaded on the each of the shelves 130 may be confirmed.

While the second transfer robot 150 transfers the wafers 10, it is prevent the second transfer robot 150 and the wafers 10 from being damaged by collision between the second transfer robot 150 and the wafers 10 loaded on the each of shelves 130.

Figure 5:
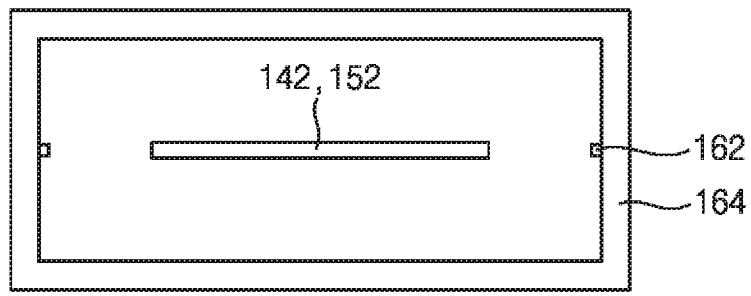
FIG. 5 is a plan view illustrating an operation of a third sensor shown in FIG. 1.

FIG. 5 is a plan view illustrating an operation of a third sensor as shown in FIG. 1.

Further referring to FIG. 5, the stocker 100 further includes a level sensing unit 160. The level sensing unit 160 is disposed on a movement path of the first transfer robot 140 and senses a height of the first robot arm 142. Also, the level sensing unit 160 is disposed on a movement path of the second transfer robot 150 and senses a height of the second robot arm 152.

For example, the level sensing unit 160 may include a pair of third sensors 162 positioned at the same height as the first robot arm 142 or the second robot arm 152 and spaced apart from each other, and a frame 164 for mounting the third sensors 162.

One of the third sensors 162 irradiates a light toward the first robot arm 142 or the second robot arm 152 and the other of the third sensors 162 detects the irradiated light. When the third sensors 162 do not detect the light, it is determined that the first robot arm 142 or the second robot arm 152 maintains a predetermined reference height. When the third sensors 162 detect the light, it is determined that the first robot arm 142 or the second robot arm 152 does not maintain the reference height.

If the first robot arm 142 or the second robot arm 152 does not maintain the reference height, the first transfer robot 140 or the second transfer robot 150 may not accurately transfer the wafer 10 and collide with the cassette 20, the aligner 120, and the shelves 130, respectively.

If the first robot arm 142 or the second robot arm 152 does not maintain the reference height as a result of a detection of the level sensing unit 160, an operation of the first transfer robot 140 and the second transfer robot 150 is stopped. Therefore, it is possible to prevent the first transfer robot 140 or the second transfer robot 150 from colliding with the cassette 20, the aligner 120, and the shelves 130.

Although the stocker has been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A stocker comprising;
   a load port which a cassette for receiving wafers is either loaded on or unloaded from;
   an aligner configured to align the wafers and to confirm identification codes of the wafers;
   a plurality of shelves, each having slots for receiving the wafers;
   a first transfer robot having a first robot arm for transferring the wafers between the load port and the aligner;
   a second transfer robot having a second robot arm for transferring the wafers between the aligner and the shelves;
   a teaching mark disposed on a bottom surface of each of the shelves for teaching the second transfer robot; and
   a teaching unit mounted on the second robot arm of the second transfer robot and being configured to obtain information for teaching the second transfer robot using the teaching mark.

2. The stocker of claim 1, wherein the aligner comprises:
   a rotating member configured to align the wafers by supporting and rotating the wafers;
   centering members arranged radially with respect to the rotating member, each being configured to be movable toward the rotating member, and to move the wafer positioned on the rotating member to align a center of the wafer with respect to a center of the rotating member; and
   a recognition unit disposed over the rotating member and being configured to recognize the identification codes of the wafers which the rotating member supports.

3. The stocker of claim 1, further comprising a controller being configured to obtain pre-stored information about wafers using the identification codes of the wafers acquired from the aligner, and to control an operation of the second transfer robot to transfer one of the wafers to one of the shelves or draw the one of the wafers from the one of the shelves according to the pre-stored information.

4. The stocker of claim 1, further comprising level sensing units arranged in a moving path of the first transfer robot and a moving path of the second transfer robot, respectively, and each having a pair of third sensors for sensing deflection of the first robot arm and deflection of the second robot arm.

5. The stocker of claim 1, further comprising;
   a reflector disposed at a front end portion of an upper surface of each of the shelves; and
   a first sensor mounted on the second transfer robot, the first sensor configured to be positioned below the reflector, and irradiate light toward the reflector to detect the light reflected by the reflector to determine whether the second transfer robot is in position and whether the wafers loaded on the shelves are protruded.

6. The stocker of claim 5, further comprising second sensors mounted on the second transfer robot and being configured to be respectively positioned at both sides of each of the wafers loaded on the each of the shelves, and to move in a vertical direction to detect whether each of the wafers is loaded on the each of the shelves.

* * * * *